July 6, 1965 E. M. CREAMER, JR., ETAL 3,193,706

SIGNAL RESPONSIVE LOAD ENERGIZATION SYSTEM

Filed Dec. 2, 1959

INVENTORS
HARRY H. WILSON, JR.
EDGAR M. CREAMER, JR.
BY
Fordyce A. Bothwell
ATTORNEY

United States Patent Office 3,193,706
Patented July 6, 1965

3,193,706

SIGNAL RESPONSIVE LOAD ENERGIZATION SYSTEM

Edgar M. Creamer, Jr., Melrose Park, and Harry H. Wilson, Jr., Philadelphia, Pa., assignors, by mesne assignments, to Philco Corporation, Philadelphia, Pa., a corporation of Delaware Filed Dec. 2, 1959, Ser. No. 856,825
3 Claims. (Cl. 307—88.5)

This invention relates to signal amplifier systems and more particularly to an amplifier system for supplying direct current of substantial magnitude to a load in response to an alternating current signal of short duration. The invention further relates to a signal amplifier system for controlled operation of a load device, such as a relay, in response to received signals which may vary considerably in amplitude.

While not limited to any particular use, the invention is particularly well suited for use in remote control operations where a signal is radiated from a remote control location which may be at various distances from the receiving location where the control function is to be performed. For example, in a remote control system for a television receiver, in which this invention has been employed, a mechanical resonator is caused to radiate a high-frequency supersonic (e.g. 40 kc.) signal of short duration (about 100 cycles) which is of decaying amplitude. In response to the received signal, a relay is operated to initiate operation of apparatus for actuating the tuner of the television receiver to change from one channel to another.

In such a remote control operation it is necessary that the relay be operated for a predetermined time interval long enough so that it will initiate the control operation but not so long as to interfere with the proper performance of the control operation. Moreover, the relay must be operated in response to received signals which vary considerably in amplitude depending upon the distance between the receiver and the location of the signal radiating means.

One object of the present invention is to provide a signal amplifier system for controlled operation of a load device in response to received signals, and which is particularly well adapted for use in a remote control system of the type referred to above.

Another object of the invention is to provide such an amplifier system which has very high power gain and yet is simple and susceptible of low cost manufacture.

A further object of the invention is to provide such an amplifier system which requires very little power.

Other objects and features of the invention will be apparent from the description to follow.

In accordance with this invention, a signal amplifier system is provided comprising means including an amplifier device for amplifying a received alternating current signal of short duration, an output circuit for said device, a current supply source and a load device serially included in said output circuit, the amplified signal in said output circuit being incapable of operating said load device, means for detecting the amplified signal to produce a control pulse, and means for utilizing said control pulse to effect strong conduction of said amplifier device for a predetermined time interval, thereby to supply current to said load device from said source of sufficient magnitude to operate the load device.

In the preferred embodiment, the amplifier system comprises at least two successive amplifier stages which, when supplied with an alternating current signal of short duration, operate initially as a conventional signal amplifier of said alternating current signal, and upon the appearance of the amplified signal in the output of the second stage said signal is detected and fed back to the input of the first stage to turn off the amplifier device in that stage. By reason of the way in which the two stages are interconnected the second amplifier device is caused to conduct strongly during a time interval of fixed duration to yield a direct current of substantial magnitude which may be utilized to actuate a relay or other load device.

The invention may be fully understood from the following detailed description with reference to the accompanying drawing wherein—

Figure 1:
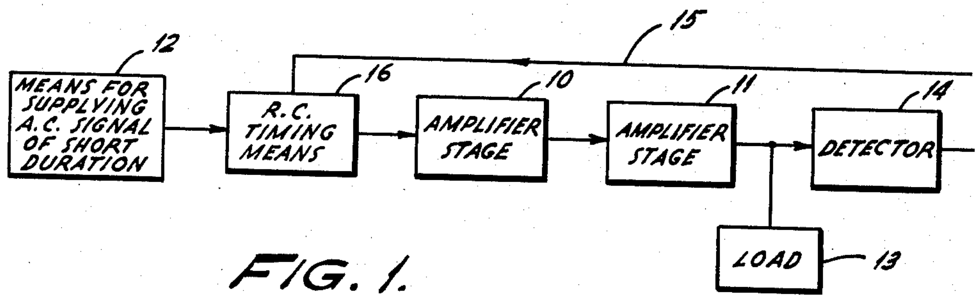
FIG. 1 is a simple block diagram of an amplifier system according to the present invention.

Referring first to FIG. 1, there is represented a system comprising two successive amplifier stages as represented at 10 and 11, the second stage being the output stage. An alternating current signal of short duration, e.g. a high frequency pulse, is supplied to the first stage 10 from signal supply means 12. A load 13 is connected to the output of stage 11, but the amplified signal is incapable of energizing the load. However the amplified A.C. signal is detected by a detector 14, and the detected signal in the form of a D.C. pulse is fed back over connection 15 to the input of stage 10. In response to the fed-back signal, the stages 10 and 11 function in the manner of a one-shot multivibrator. The amplifier device of stage 10 is turned off and this causes the amplifier device of stage 11 to supply D.C. current of substantial magnitude to the load 13, as hereinafter described with reference to the preferred embodiment shown in FIG. 3. The duration of said current is determined by resistance-capacitance timing means 16 which in the preferred form of the system comprises elements in the feedback loop and the input of stage 10, as hereinafter described.

Figure 2:
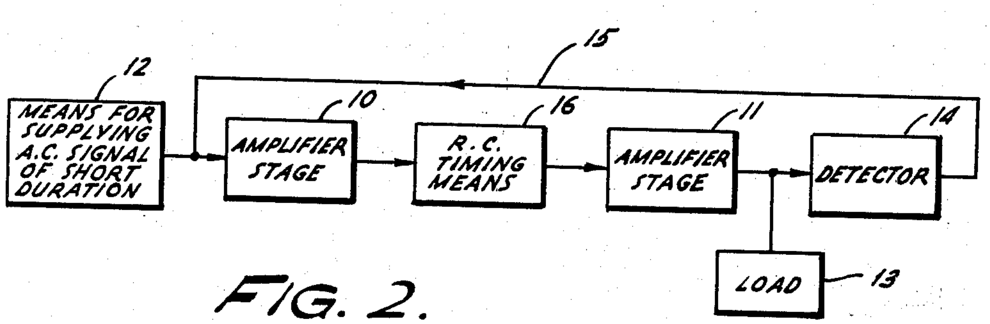
FIG. 2 is a similar diagram of an alternative form of system.

FIG. 2 shows the same form of system with the resistance-capacitance timing means 16 comprising elements intermediate the stages 10 and 11.

Figure 3:
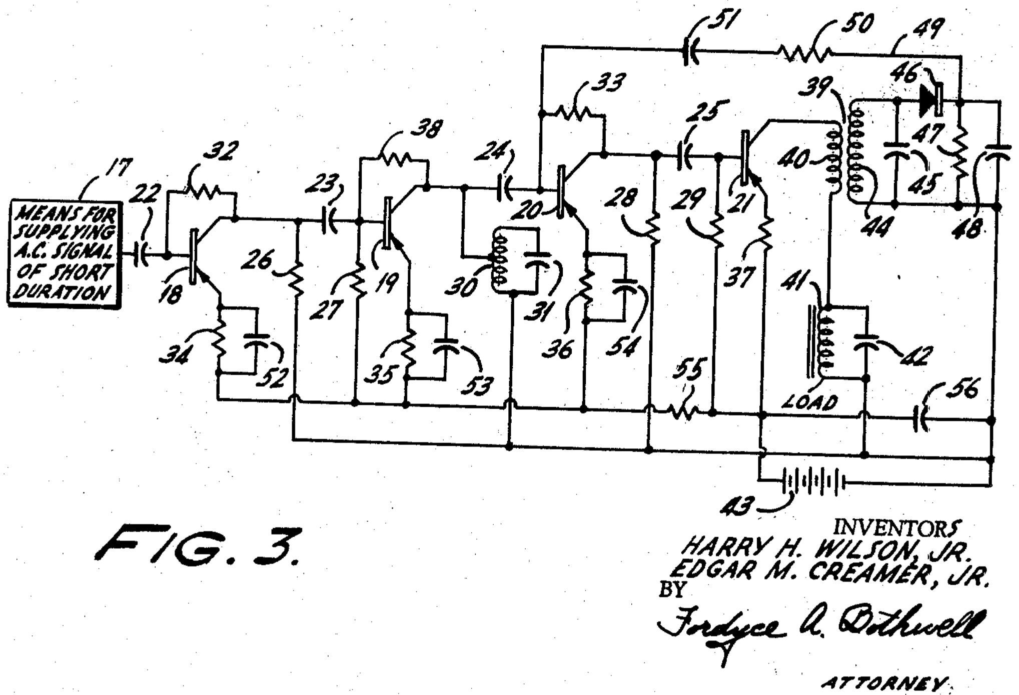
FIG. 3 is a schematic illustration of a preferred embodiment of the invention adapted to operate a relay in response to an alternating current signal of short duration.

Referring now to FIG. 3, the system illustrated has been used as the receiver of a system for remote control of a television receiver. It is of the preferred form represented in FIG. 1. The transmitter, with which we are not here concerned, is a mechanical resonator which radiates a strong supersonic signal of short duration as hereinbefore mentioned. The receiver transducer converts the supersonic signal to an electrical signal of the same frequency. Thus the transducer is the signal supply means 17 in FIG. 3. The receiver system of FIG. 3 operates a relay to effect control of an associated television receiver. While the multi-stage amplifier system of FIG. 3 employs transistors, it will be apparent from the following description that vacuum tubes could be used.

The amplifier system shown in FIG. 3 comprises four successive amplifier stages including transistors 18 to 21 which are shown as being of the P-N-P type, although of course transistors of the N-P-N type could be used. Generally speaking, the amplifier system shown comprises four conventionally coupled transistors, employing capacitors 22 to 25, resistors 26 to 29, and tuned circuit 30, 31.

Resistors 32 and 33, each of which is connected between the base and collector of the associated transistor, are heat-compensating elements. Whenever heat generated by the television receiver causes an increase in the collector current and consequent rise of the collector voltage due to increase of the voltage across load resistors 26 and 28, the resistors 32 and 33 apply the voltage rise as a reverse bias to the bases of the transistors to decrease the collector current.

Resistors 34, 35, 36 and 37 are likewise heat-compensating and bias elements. As the current through them increases, the voltage drop also increases and thus decreases the forward bias to decrease the collector current.

The tuned circuit comprising inductor 30 and capacitor 31 is tuned to the signal frequency and helps to make the amplifier system highly selective.

Resistor 38, which is connected between the base and collector of transistor 19, serves in conjunction with resistor 27 as a voltage divider for the base circuit of transistor 19.

In the four-stage amplifier system of FIG. 3, the third and fourth stages including transistors 20 and 21 correspond to the stages 10 and 11 of FIGS. 1 and 2.

A transformer 39 has its primary 40 connected in the output circuit of the last stage. Also included in said output circuit, in series with said primary, is the load which in this case is the winding 41 of a relay shunted by a capactor 42. It will be understood of course that the load may be of any desired form depending on the use to which the system is put. Also included in said output circuit is the current supply source, represented by battery 43, which is common to all of the stages.

The secondary 44 of transformer 39 is tuned to the frequency of the signal by capacitor 45, and this also helps to make the amplifier system highly selective. Connected in series with the tuned secondary is a diode detector 46 (preferably a crystal diode) and its load circuit comprising resistor 47 and capacitor 48. A feedback connection 49, including resistor 50 and capacitor 51, extends from the detector circuit back to the input of the third stage, i.e. to the base of transistor 20.

In operation, a high frequency A.C. signal of short duration from the signal supply means 17 is amplified in the four stages and is detected by the diode 46. At this time the collector current in the output circuit of transistor 21 is insufficient to operate the relay. A positive D.C. pulse is fed back from the detector circuit to the base or control electrode of transistor 20 through resistor 50 and capacitor 51. The pulse cuts off transistor 20 and the negative-going voltage at its collector is applied through capacitor 25 to the base or control electrode of transistor 21 and drives the latter into strong conduction. The consequent strong current then supplied by the current source 43 flows through relay winding 41 and causes the relay to operate.

In the preferred embodiment shown in FIG. 3, the parameters may be such that the time interval during which transistor 20 is cut off and transistor 21 is in strong conduction, i.e. the time interval during which the relay is energized, is determined by the time constant of elements 51 and 33 which constitute the RC timing means represented at 16 in FIG. 1. The time constant of elements 24 and 33 is short compared to that of elements 47 and 48. The pulse delivered by way of the feedback loop charges capacitor 51, and the principal timing factor is the discharge of said capacitor. At the end of the time interval, transistor 20 turns on and the positive-going voltage at its collector decreases the conduction of transistor 21 to deenergize the relay.

It will be seen from the foregoing that the third and fourth stages serve a dual purpose. First they help to amplify the received alternating current signal, and then they operate in the manner of a one-shot multivibrator in that the pulse fed back from the detector circuit effectively triggers said stages to produce an output which persists during a predetermined time interval.

Some of the advantages of an amplifier according to this invention, such as shown in FIG. 3, are that it gives very high power gain with a minimum of stages and cost; it requires very little power (the amplifier now in use has a power drain of less than three watts); and the time duration of energization of the load is constant and is independent of the input signal level, and therefore the operation is the same over a wide range of signal input levels. It should be noted also that the long time constant of the detector load provides protection against high level, short-duty-cycle noise, and if desired the detector diode may be biased off a small amount to give protection from a low level continuous interference.

By way of example, the values of the circuit components of the amplifier shown in FIG. 3 may be as follows:

| | | |
|---|---|---|
| Capacitors 22, 23 and 24 | micro-microfarads | .0082 |
| Capacitor 25 | microfarads | 100 |
| Resistors 26, 34 and 35 | kilohms | 2.2 |
| Resistors 27 and 50 | do | 10 |
| Resistors 28 and 29 | do | 3.9 |
| Capacitor 31 | micro-microfarads | 3300 |
| Resistor 32 | kilohms | 220 |
| Resistor 33 | do | 180 |
| Resistor 36 | do | 1.5 |
| Resistor 37 | ohms | 82 |
| Resistor 38 | kilohms | 47 |
| Capacitors 42, 48, 52, 53 and 54 | micro-microfarads | .1 |
| Capacitor 45 | do | 2700 |
| Resistor 47 | kilohms | 100 |
| Capacitor 51 | microfarads | 5 |
| Resistor 55 | ohms | 220 |
| Capacitor 56 | microfarads | 1125 |

Referring again to FIG. 2, which differs from FIG. 1 in that the RC timing means is interposed between the stages 10 and 11, it will be apparent that the system of FIG. 3 could be modified to correspond to FIG. 2 rather than FIG. 1. Thus in the system of FIG. 3, the time interval during which transistor 21 is strongly conductive and the relay is energized could be determined by the time constant of capacitor 25 and resistor 28. In the system of FIG. 3 that time constant is long in comparison to that of elements 51 and 33, so that the latter are controlling. While it would be less desirable, it will be apparent that the system could be modified so that the time constant of elements 25 and 28 would be controlling.

While in the preferred embodiment of the invention as described at least two amplifier stages are employed which serve first to amplify the received A.C. signal which is detected and then serve to effect energization of the load device in response to the detected signal, for some uses of the invention a single amplifier stage might be employed. For example, assume a system having only the last stage of FIG. 3. The transistor 21 would amplify the signal which would be detected by the diode detector to produce a control pulse. The latter could then be utilized to effect the strong conduction of transistor 21 to energize the relay. For example, the control pulse could be derived from the opposite side of the detector load so that it would be of negative polarity, and it could be supplied through capacitor 25 to the base of transistor 21 to drive the latter into strong conduction.

Thus while a preferred embodiment of the invention has been illustrated and described, it will be understood that the invention is not limited thereto but contemplates such modifications and other embodiments as may occur to those skilled in the art.

We claim:

1. A system for operating a device such as a relay in response to an alternating current signal of short duration and for a predetermined time interval independent of the duration of said signal, comprising: a source of said signal, amplifier means connected to said source including at least two cascade-connected transistor stages, the transistors being of the same conductivity type, the first stage including a collector load resistor, the base of the second transistor being coupled to the collector of the first transistor so that the conductivity of the second transistor varies in inverse relation to variation of the conductivity of the first transistor, means for rendering both of said transistors normally conductive, a device to be operated connected in the emitter-collector circuit of the second transistor, means for rectifying the amplified signal in the latter circuit to produce a control pulse, a connection from said rectifying means to the base of the first transistor to effect turn-off of the first transistor by said control pulse, thereby to effect strong conduction of the second transistor and consequent operation of said device, and timing means for maintaining the strong conduction of said second transistor and the consequent operation of said device for a predetermined time interval irrespective of the duration of said signal.

2. A system according to claim 1, wherein said timing means comprises a capacitor and a resistor through which the capacitor discharges to define the predetermined time interval, said timing elements being located in the control path between said rectifying means and the base of said second transistor.

3. A system for operating a device such as a relay in response to an alternating current signal of short duration and for a predetermined time interval independent of the duration of said signal, comprising: a source of said signal, amplifier means connected to said source including at least two cascade-connected transistor stages, the transistors being of the same conductivity type, the first stage including a collector load resistor, the base of the second transistor being coupled to the collector of the first transistor so that the conductivity of the second transistor varies in inverse relation to variation of the conductivity of the first transistor, a direct current supply source connected in the emitter-collector circuits of both of said transistors so as to render them normally conductive, a device to be operated connected in the emitter-collector circuit of the second transistor, means for rectifying the amplified signal in the latter circuit to produce a control pulse, a feedback connection from said rectifying means to the base of the first transistor to effect turn-off of the first transistor by said control pulse, thereby to effect strong conduction of the second transistor and consequent operation of said device, a capacitor included in said feedback connection, and a resistor connected between the base and collector of the first transistor, whereby said control pulse charges said capacitor and the time of discharge thereof through the last-named resistor determines the time of operation of said device.

References Cited by the Examiner

UNITED STATES PATENTS

| | | | |
|---|---|---|---|
| 2,721,937 | 10/55 | Braga | 328—200 |
| 2,764,688 | 9/56 | Grayson et al. | 307—88.5 |
| 2,828,450 | 3/58 | Pinckaers | 330—26 |
| 2,840,727 | 6/58 | Guggi | 307—88.5 |
| 2,947,875 | 8/60 | Beck | 307—88.5 |
| 3,002,109 | 9/61 | Baird | 307—88.5 |
| 3,050,661 | 8/62 | Jenkins | 307—88.5 |
| 3,097,310 | 7/63 | Sevilla | 307—88.5 |

FOREIGN PATENTS

| | | |
|---|---|---|
| 220,710 | 2/59 | Australia. |

JOHN W. HUCKERT, *Primary Examiner.*

GEORGE N. WESTBY, *Examiner.*